(12) United States Patent
Muramoto et al.

(10) Patent No.: US 12,451,853 B2
(45) Date of Patent: Oct. 21, 2025

(54) FILTER DEVICE AND RADIO-FREQUENCY FRONT-END CIRCUIT

(71) Applicant: Murata Manufacturing Co., Ltd., Nagaokakyo (JP)

(72) Inventors: Kazuyuki Muramoto, Nagaokakyo (JP); Takuya Sato, Nagaokakyo (JP); Keisuke Ogawa, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 162 days.

(21) Appl. No.: 18/404,945

(22) Filed: Jan. 5, 2024

(65) Prior Publication Data

US 2024/0250654 A1 Jul. 25, 2024

(30) Foreign Application Priority Data

Jan. 20, 2023 (JP) .................. 2023-007400

(51) Int. Cl.
*H03H 1/00* (2006.01)
*H03H 7/01* (2006.01)
(52) U.S. Cl.
CPC ............ *H03H 1/00* (2013.01); *H03H 7/0115* (2013.01); *H03H 2001/0085* (2013.01)
(58) Field of Classification Search
CPC . H03H 7/0115; H03H 1/00; H03H 2001/0085
See application file for complete search history.

(56) References Cited

U.S. PATENT DOCUMENTS

| 2019/0181826 | A1* | 6/2019 | Imamura | H03H 7/1775 |
| 2020/0389145 | A1* | 12/2020 | Takahashi | H03H 7/1725 |
| 2022/0209736 | A1 | 6/2022 | Ogawa | |
| 2023/0188111 | A1* | 6/2023 | Ogawa | H03H 7/0161 333/185 |
| 2025/0022647 | A1* | 1/2025 | Lim | H01F 27/34 |

FOREIGN PATENT DOCUMENTS

WO 2021/079737 A1 4/2021

\* cited by examiner

*Primary Examiner* — Quan Tra
(74) *Attorney, Agent, or Firm* — Keating & Bennett, LLP

(57) ABSTRACT

A filter device includes a stacked body, an input terminal, an output terminal, a ground terminal, a ground electrode, first and second resonators, and a coupling electrode. The input, output and ground terminals are located on a lower surface of the stacked body. The first and second resonators are in a signal transmission path between the input and output terminals. The coupling electrode capacitively couples the first and second resonators. The first and second resonators respectively include first and second capacitor electrodes defining capacitors with the ground electrode. The coupling electrode is connected to the first capacitor electrode and defines a capacitor with the second capacitor electrode. The coupling electrode includes first and second electrodes. First ends of the first and second electrodes are connected to each other. Second ends of the first and second electrodes are connected to the first capacitor electrode.

20 Claims, 9 Drawing Sheets

FILTER DEVICE AND RADIO-FREQUENCY FRONT-END CIRCUIT

CROSS REFERENCE TO RELATED APPLICATIONS

This application claims the benefit of priority to Japanese Patent Application No. 2023-007400 filed on Jan. 20, 2023. The entire contents of this application are hereby incorporated herein by reference.

BACKGROUND OF THE INVENTION

1. Field of the Invention

The present disclosure relates to filter devices and radio-frequency front-end circuits, and more specifically relates to techniques to improve attenuation characteristics of filter devices.

2. Description of the Related Art

WO 2021/079737 discloses a filter device including multiple stages of LC parallel resonators. In the filter device disclosed in WO 2021/079737, adjacent resonators are electromagnetically coupled to each other and capacitively coupled to each other by a capacitor so as to transmit a signal within a desired frequency band from an input terminal to an output terminal.

In the filter device disclosed in WO 2021/079737, the capacitive coupling between adjacent resonators is achieved by a capacitor which is formed by a plate electrode extending from one resonator and a plate electrode of the other resonator.

The plate electrode extending from one resonator has a certain length, and therefore also functions as an inductor having a predetermined inductance value. Therefore, the plate electrode defining the capacitor may become a distributed constant LC parallel resonator, which unintentionally reduces the attenuation characteristics near the resonance frequency of the plate electrode.

In recent years, communications have been conducted based on a plurality of communication standards in different frequency bands. If the attenuation characteristics of the filter device are reduced in a frequency band (i.e., the non-passband) other than a passband targeted by the filter device, this may have an adverse effect on other communication apparatuses using a frequency band within the non-passband. Further, in the filter device, a signal in a frequency band with reduced attenuation characteristics may appear as noise.

SUMMARY OF THE INVENTION

Example embodiments of the present invention provide filter devices in each of which a reduction of attenuation characteristics caused by capacitive coupling between multi-stage resonators is prevented.

A filter device according to an example embodiment of the present invention includes a stacked body including a plurality of dielectric layers that are stacked, an input terminal, an output terminal, a ground terminal, a ground electrode connected to the ground terminal, a first resonator, a second resonator, and a coupling electrode. The stacked body includes a first surface and a second surface. The input terminal, the output terminal, and the ground terminal are provided on the second surface of the stacked body. The ground electrode is inside the stacked body. The first resonator and the second resonator are provided in a signal transmission path between the input terminal and the output terminal on a dielectric layer between the first surface and the ground electrode. The coupling electrode couples the first resonator and the second resonator via capacitive coupling. The first resonator includes a first capacitor electrode defining a capacitor with the ground electrode, and the second resonator includes a second capacitor electrode defining a capacitor with the ground electrode. The coupling electrode is connected to the second capacitor electrode and defines a capacitor with the first capacitor electrode. The coupling electrode includes a first electrode and a second electrode, each of which includes a first end and a second end. The first end of the first electrode and the first end of the second electrode are connected to each other. The second end of the first electrode and the second end of the second electrode are connected to the second capacitor electrode.

The above and other elements, features, steps, characteristics and advantages of the present invention will become more apparent from the following detailed description of the example embodiments with reference to the attached drawings.

DETAILED DESCRIPTION OF THE EXAMPLE EMBODIMENTS

Figure 1:
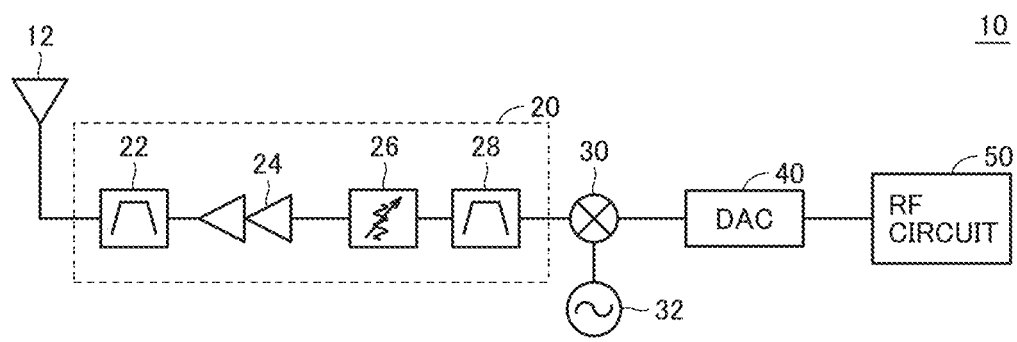
FIG. 1 is a block diagram illustrating a communication apparatus including a radio-frequency front-end circuit to which a filter device according to an example embodiment of the present invention is applied.

Hereinafter, example embodiments of the present disclosure will be described in detail with reference to the accompanying drawings. In the drawings, the same or equivalent portions will be denoted by the same reference numerals, and the description thereof will not be repeated.

Example Embodiment

Basic Configuration of Communication Apparatus

FIG. 1 is a block diagram illustrating a communication apparatus 10 including a radio-frequency front-end circuit 20 to which a filter device 100 of the present example embodiment is applied. The communication apparatus 10 is, for example, a mobile terminal such as a smartphone, or a mobile base station.

With reference to FIG. 1, the communication apparatus 10 includes an antenna 12, a radio-frequency front-end circuit 20, a mixer 30, a local oscillator 32, a D/A converter (DAC) 40, and an RF circuit 50. The radio-frequency front-end circuit 20 includes a band-pass filter 22, a band-pass filter 28, an amplifier 24, and an attenuator 26. Although FIG. 1 illustrates a case where the radio-frequency front-end circuit 20 includes a transmission circuit that transmits a radio-frequency signal from the antenna 12, the radio-frequency front-end circuit 20 may include a reception circuit that receives a radio-frequency signal via the antenna 12.

The communication apparatus 10 up-converts a transmission signal output from the RF circuit 50 into a radio-frequency signal and transmits the radio-frequency signal from the antenna 12. The D/A converter 40 converts the modulated digital signal (the transmission signal output from the RF circuit 50) into an analog signal. The mixer 30 mixes the transmission signal which is converted by the D/A converter 40 from the digital signal to the analog signal with an oscillation signal from the local oscillator 32, and up-converts the mixed signal to a radio-frequency signal. The band-pass filter 28 filters out unwanted waves generated in the up-conversion process and extracts only the transmission signal within a desired frequency band. The attenuator 26 adjusts the intensity of the transmission signal. The amplifier 24 amplifies the transmission signal that has passed through the attenuator 26 to a predetermined level. The band-pass filter 22 filters out unwanted waves generated in the amplification process and allows only the signal within a frequency band determined by the communication standard to pass through. The transmission signal that has passed through the band-pass filter 22 is transmitted from the antenna 12.

The filter device according to the present example embodiment may be used as the band-pass filters 22 and 28 in the communication apparatus 10 described above.

Configuration of Filter Device

Next, a detailed configuration of the filter device 100 according to the present example embodiment will be described with reference to FIGS. 2 to 4.

(1) Equivalent Circuit

Figure 2:
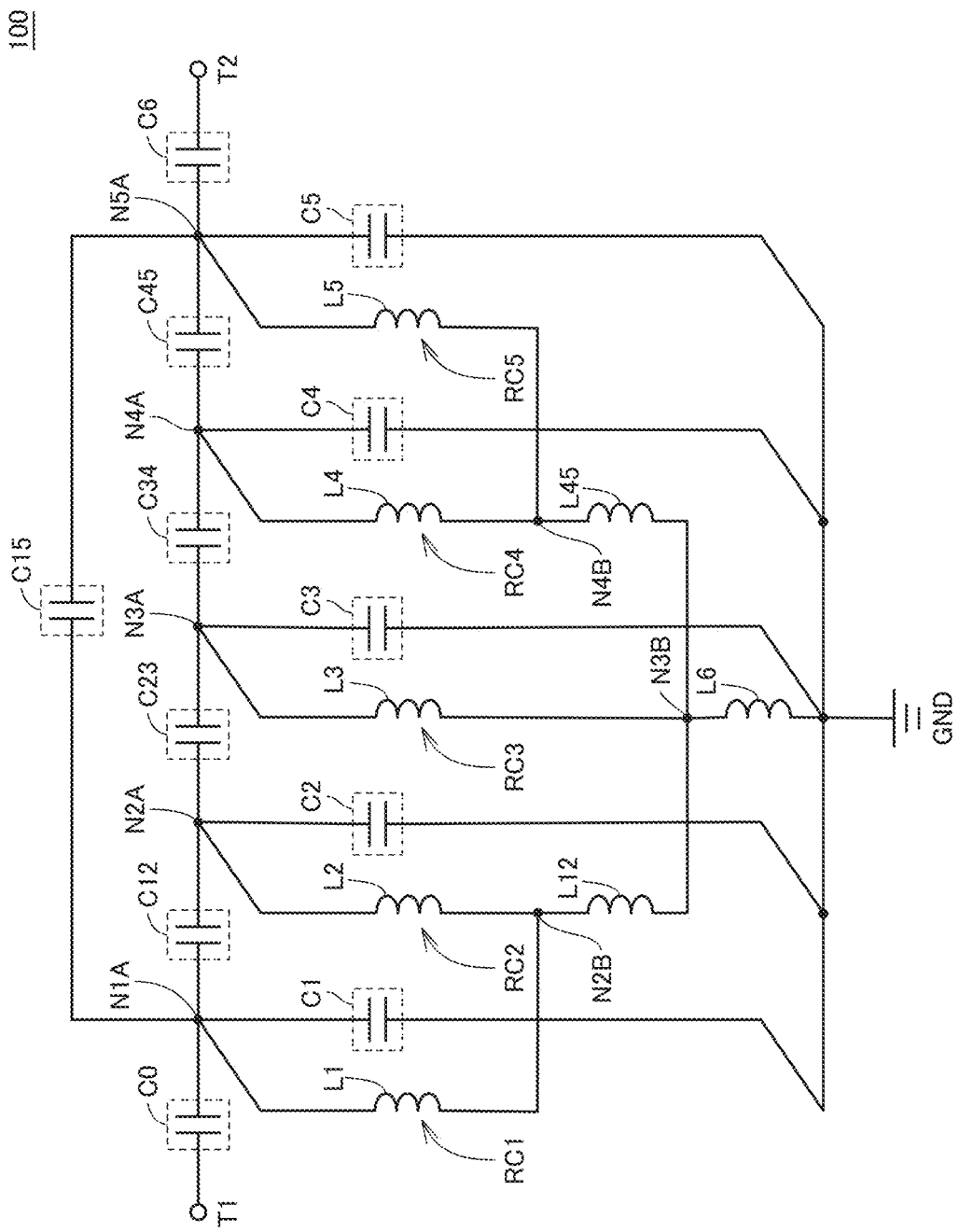
FIG. 2 is an equivalent circuit diagram illustrating a filter device according to an example embodiment of the present invention.

FIG. 2 is an equivalent circuit diagram illustrating the filter device 100. With reference to FIG. 2, the filter device 100 includes an input terminal T1, an output terminal T2, and resonators RC1 to RC5. Each of the resonators RC1 to RC5 is an LC parallel resonator in h an inductor and a capacitor are connected in parallel.

The resonator RC1 is connected to the input terminal T1 via a capacitor C0. The resonator RC1 includes inductors L1, L12 and L6, and a capacitor C1. The inductors L1, L12 and L6 are connected in series between a connection node N1A connected to the capacitor C0 and a ground terminal GND. The capacitor C1 is also connected between the connection node NIA and the ground terminal GND. In other words, the resonator RC1 is an LC parallel resonator in which a composite inductor obtained by connecting the inductors L1, L12 and L6 in series and the capacitor C1 are connected in parallel.

The resonator RC2 includes inductors L2, L12 and L6, and a capacitor C2. One end of the inductor L2 is connected to a connection node N2B between the inductor L1 and the inductor L12. The other end of the inductor L2 is connected to the ground terminal GND via the capacitor C2. In other words, the resonator RC2 is an LC parallel resonator in which a composite inductor obtained by connecting the inductors L2, L12 and L6 in series and the capacitor C2 are connected in parallel.

A connection node N2A between the inductor L2 and the capacitor C2 is connected to the connection node NIA of the resonator RC1 via the capacitor C12. In other words, the resonator RC2 is capacitively coupled to the resonator RC1 via the capacitor C12.

The resonator RC3 includes inductors L3 and L6, and a capacitor C3. One end of the inductor L3 is connected to a connection node N3B between the inductor L12 and the inductor L6. The other end of the inductor L3 is connected to the ground terminal GND via the capacitor C3. In other words, the resonator RC3 is an LC parallel resonator in which a composite inductor obtained by connecting the inductors L3 and L6 in series and the capacitor C3 are connected in parallel.

A connection node N3A between the inductor L3 and the capacitor C3 is connected to the connection node N2A of the resonator RC2 via a capacitor C23. In other words, the resonator RC3 is capacitively coupled to the resonator RC2 via the capacitor C23.

The resonator RC4 includes inductors L4, L45 and L6, and a capacitor C4. One end of the inductor L4 is connected to one end of the inductor L45. The other end of the inductor L4 is connected to the ground terminal GND via the capacitor C4. The other end of the inductor L45 is connected to the connection node N3B between the inductor L3 and the inductor L6 of the resonator RC3. In other words, the resonator RC4 is an LC parallel resonator in which a composite inductor obtained by connecting the inductors L4, L45 and L6 in series and the capacitor C4 are connected in parallel.

A connection node N4A between the inductor L4 and the capacitor C4 is connected to the connection node N3A of the resonator RC3 via the capacitor C34. In other words, the resonator RC4 is capacitively coupled to the resonator RC3 via the capacitor C34.

The resonator RC5 includes inductors L5, L45 and L6, and a capacitor C5. One end of the inductor L5 is connected to a connection node N4B between the inductor L4 and the inductor L45 of the resonator RC4. The other end of the inductor L5 is connected to the ground terminal GND via the capacitor C5. In other words, the resonator RC5 is an LC parallel resonator in which a composite inductor obtained by connecting the inductors L5, L45 and L6 in series and the capacitor C5 are connected in parallel.

A connection node N5A between the inductor L5 and the capacitor C5 is connected to the connection node N4A of the resonator RC4 via the capacitor C45. In other words, the resonator RC5 is capacitively coupled to the resonator RC4 via the capacitor C45. The connection node N5A of the resonator RC5 is connected to the output terminal T2 via the capacitor C6. Further, a capacitor C15 is connected between the connection node N5A of the resonator RC5 and the connection node N1A of the resonator RC1.

As described above, the inductor L12 is shared by the resonator RC1 and the resonator RC2. Similarly, the inductor L45 is shared by the resonator RC4 and the resonator RC5, and the inductor L6 is shared by the resonators RC1 to RC5.

In addition, the resonators are magnetically coupled to each other. Thus, the filter device 100 includes, for example, five stages of resonators that are magnetically and capacitively coupled to each other and disposed in a signal transmission path between the input terminal T1 and the output terminal T2. Thus, the filter device 100 defines and functions as a band-pass filter that allows a signal within a desired frequency band to pass through by adjusting the resonance frequency of each resonator. The number of resonators included in the filter device is an example, and the features of example embodiments of the present invention may be applied to a filter device that includes two or more resonators.

(2) Detailed Structure

Next, the structure of the filter device 100 will be described with reference to FIGS. 3 and 4. FIG. 3 is an external perspective view illustrating the filter device 100, and FIG. 4 is an exploded perspective view illustrating an example stacked body of the filter device 100.

Figure 3:
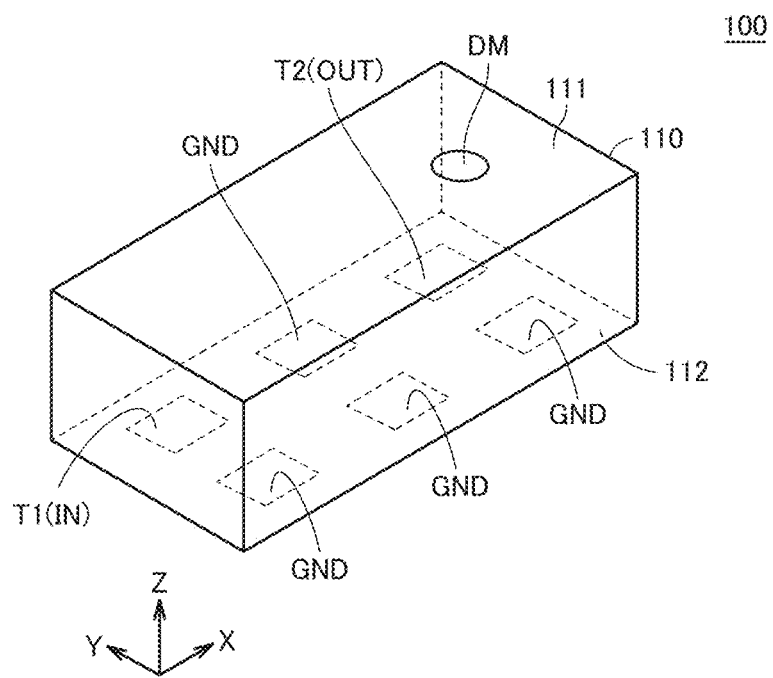
FIG. 3 is an external perspective view illustrating a filter device according to an example embodiment of the present invention.
Figure 4:
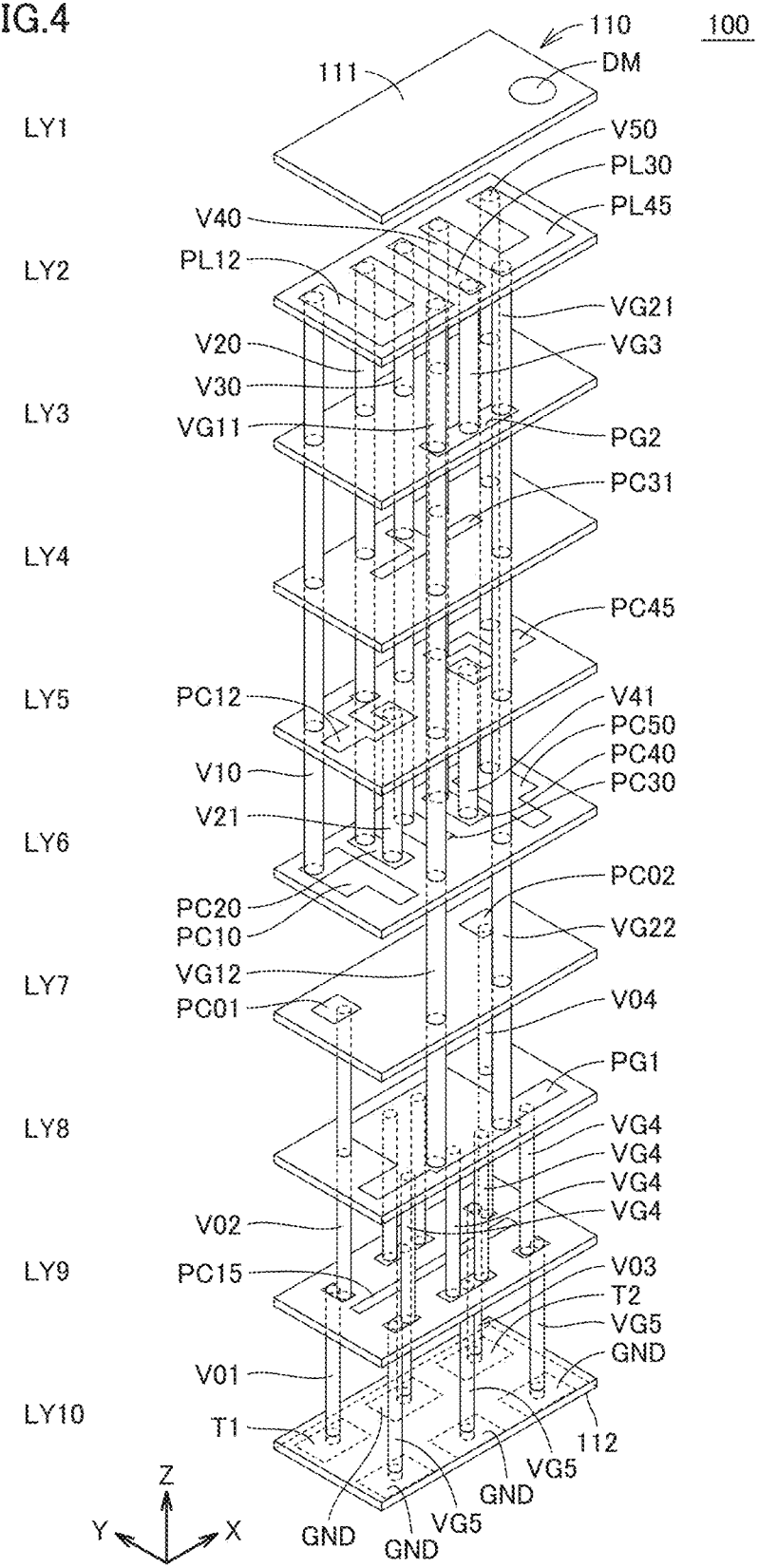
FIG. 4 is an exploded perspective view illustrating an example stacked body of the filter device of FIG. 3.

With reference to FIGS. 3 and 4, the filter device 100 includes a cuboid or substantially cuboid stacked body 110 which includes a plurality of dielectric layers LY1 to LY10 stacked in the stacking direction. Each of the dielectric layers LY1 to LY10 is made of, for example, ceramics, such as low temperature co-fired ceramics (LTCC), or resin. Inside the stacked body 110, a plurality of electrodes disposed on each dielectric layer and a plurality of vias disposed between the dielectric layers define an inductor and a capacitor of the LC parallel resonator. In the present specification, the term "via" denotes a conductor that extends in the stacking direction so as to connect conductors provided in different dielectric layers. The via is formed by, for example, conductive paste, plating, and/or a metal pin.

In the following description, the stacking direction of the dielectric layers LY1 to LY10 in the stacked body 110 is set as "Z-axis direction", the direction orthogonal or substantially orthogonal to the Z-axis direction and along the long side of the stacked body 110 is set as "X-axis direction", and the direction orthogonal or substantially orthogonal to the Z-axis direction and along the short side of the stacked body 110 is set as "Y-axis direction". In addition, in the following description, the positive direction of the Z-axis in each drawing may be referred to as an upper side and the negative direction thereof may be referred to as a lower side.

An upper surface 111 (i.e., the dielectric layer LY1) of the stacked body 110 includes a direction mark DM that indicates the direction of the filter device 100. A lower surface 112 (i.e., the dielectric layer LY10) of the stacked body 110 includes external terminals (i.e., the input terminal 11, the output terminal 12, and a plurality of ground terminals GND) to connect the filter device 100 to an external device. Each of the input terminal T1, the output terminal 12, and the ground terminal GND is a plate electrode, and is, for example, an LGA (Land Grid Array) terminal regularly arranged on the lower surface 112 of the stacked body 110.

As described with reference to FIG. 2, the filter device 100 includes five resonators RC1 to RC5, each of which is an LC parallel resonator. More specifically, the resonator RC1 includes a via V10, a capacitor electrode PC10, and a plate electrode PL12. The resonator RC2 includes a via V20, a via V21, a capacitor electrode PC20, and a plate electrode PL12. The resonator RC3 includes a via V30 and a capacitor electrode PC30. The resonator RC4 includes a via V40, a via V41, a capacitor electrode PC40, and a plate electrode PL45. The resonator RC5 includes a via V50, a capacitor electrode PC50, and a plate electrode PL45.

The input terminal T1 is connected, by a via V01 and a via V02, to the capacitor electrode PC01 disposed on the dielectric layer LY7. The vias V01 and V02 are offset from each other on the dielectric layer LY9.

The capacitor electrode PC10 of the resonator RC1 is disposed on the dielectric layer LY6. A portion of the capacitor electrode PC10 overlaps the capacitor electrode PC01 of the dielectric layer LY7 when viewed from the stacking direction (Z-axis direction) of the stacked body 110. The capacitor C0 in FIG. 2 is structured by the capacitor electrode PC10 and the capacitor electrode PC01.

Another portion of the capacitor electrode PC10 overlaps a ground electrode PG1 disposed on the dielectric layer LY8, when viewed from the stacking direction of the stacked body 110. The ground electrode PG1 is connected, by a plurality of vias VG4 and a plurality of vias VG5, to the ground terminal GND disposed on the lower surface 112. In other words, the capacitor C1 in FIG. 2 is structured by the capacitor electrode PC10 and the ground electrode PG1.

The capacitor electrode PC10 is connected, by the via V10, to the plate electrode PL12 disposed on the dielectric layer LY2. The plate electrode PL12 is a strip electrode with a U or substantially U shape, and one end of the plate electrode PL12 is connected to the via V10. A via VG11 is connected to a substantially central portion of the plate electrode PL12. The via VG11 is also connected to a ground electrode PG2 disposed on the dielectric layer LY3. The ground electrode PG2 is connected to the ground electrode PG1 of the dielectric layer LY8 by vias VG12 and VG22.

The inductor L1 in FIG. 2 is structured by the via V10 and a portion of the plate electrode PL12 located between the connection point to the via V10 and the connection point to the via VG11. The inductor L12 in FIG. 2 is structured by the via VG11. Further, the inductor L6 in FIG. 2 is structured by the vias VG12 and VG22 and the vias VG4 and VG5.

The via V20 is connected to the other end of the plate electrode PL12. The via V20 is also connected to the capacitor electrode PC20 disposed on the dielectric layer LY6. The capacitor electrode PC20 is adjacent to the capacitor electrode PC10 on the dielectric layer LY6. The capacitor electrode PC20 overlaps the ground electrode PG1 of the dielectric layer LY8 when viewed from the stacking direction of the stacked body 110. In other words, the capacitor C2 in FIG. 2 is structured by the capacitor electrode PC20 and the ground electrode PG1.

The via V20 is also connected to the capacitor electrode PC12 disposed on the dielectric layer LY5. The capacitor electrode PC12 is connected to the capacitor electrode PC20 by the via V21. The capacitor electrode PC12 has a Y shape or a substantially Y shape. A first end of the capacitor electrode PC12 is connected to the via V20, and a second end thereof is connected to the via V21. A third end of the capacitor electrode PC12 overlaps the capacitor electrode PC10 in the resonator RC1 when viewed from the stacking direction of the stacked body 110. In other words, the capacitor C12 in FIG. 2 is structured by the capacitor electrode PC12 and the capacitor electrode PC10.

The inductor L2 in FIG. 2 is structured by the via V20 and a portion of the plate electrode PL12 located between the connection point to the via V20 and the connection point to the via VG11.

The output terminal T2 is connected, by a via V03 and a via V04, to the capacitor electrode PC02 disposed on the dielectric layer LY7. The vias V03 and V04 are offset from each other on the dielectric layer LY9.

The capacitor electrode PC50 of the resonator RC5 is disposed on the dielectric layer LY6. A portion of the capacitor electrode PC50 overlaps the capacitor electrode PC02 of the dielectric layer LY7 when viewed from the stacking direction of the stacked body 110. The capacitor C6 in FIG. 2 is structured by the capacitor electrode PC50 and the capacitor electrode PC02.

Another portion of the capacitor electrode PC50 overlaps the ground electrode PG1 disposed on the dielectric layer LY8, when viewed from the stacking direction of the stacked body 110. In other words, the capacitor C5 in FIG. 2 is structured by the capacitor electrode PC50 and the ground electrode PG1.

The capacitor electrode PC50 is connected, by the via V50, to the plate electrode PL45 disposed on the dielectric layer LY2. The plate electrode PL45 is a strip electrode with a U or substantially U shape, and one end of the plate electrode PL45 is connected to the via V50. A via VG21 is connected to a substantially central portion of the plate electrode PL45. The via VG21 is also connected to the ground electrode PG2 disposed on the dielectric layer LY3.

The inductor L5 in FIG. 2 is structured by the via V50 and a portion of the plate electrode PL45 located between the connection point to the via V50 and the connection point to the via VG21. The inductor L45 in FIG. 2 is structured by the via VG21.

The other end of the plate electrode PL45 is connected to the via V40. The via V40 is connected to the capacitor electrode PC40 disposed on the dielectric layer LY6. The capacitor electrode PC40 is disposed adjacent to the capacitor electrode PC50 on the dielectric layer LY6. The capacitor electrode PC40 overlaps the ground electrode PG1 of the dielectric layer LY8 when viewed from the stacking direction of the stacked body 110. In other words, the capacitor C4 in FIG. 2 is structured by the capacitor electrode PC40 and the ground electrode PG1.

The via V40 is also connected to the capacitor electrode PC45 disposed on the dielectric layer LY5. The capacitor electrode PC45 is connected to the capacitor electrode PC40 via the via V41. The capacitor electrode PC45 has a Y or substantially Y shape. A first end of the capacitor electrode PC45 is connected to the via V40, and a second end thereof is connected to the via V41. A third end of the capacitor electrode PC45 overlaps the capacitor electrode PC50 of the resonator RC5 when viewed from the stacking direction of the stacked body 110. In other words, the capacitor C45 in FIG. 2 is structured by the capacitor electrode PC45 and the capacitor electrode PC50.

The inductor L4 in FIG. 2 is structured by the via V40 and a portion of the plate electrode PL45 located between the connection point to the via V40 and the connection point to the via VG21.

The capacitor electrode PC30 disposed on the dielectric layer LY6 between the capacitor electrode PC20 of the resonator RC2 and the capacitor electrode PC40 of the resonator RC4. The capacitor electrode PC30 overlaps the ground electrode PG1 of the dielectric layer LY8 when viewed from the stacking direction of the stacked body 110.

In other words, the capacitor PC3 in FIG. 2 is structured by the capacitor electrode PC30 and the ground electrode PG1.

The capacitor electrode PC30 is connected, by the via V30, to the plate electrode PL30 disposed on the dielectric layer LY2. The plate electrode PL30 is a strip electrode extending in the Y-axis direction. One end of the plate electrode PL30 is connected to the via V30, and the other end thereof is connected to the via VG3. The via VG3 is connected to the ground electrode PG2 of the dielectric layer LY3. The inductor L3 in FIG. 2 is structured by the vias V30 and VG3 and the plate electrode PL30.

The via V30 is also connected to the capacitor electrode PC31 disposed on the dielectric layer LY4. The capacitor electrode PC31 is a plate electrode with a T or substantially T shape. A portion of the capacitor electrode PC31 overlaps the capacitor electrode PC12 of the dielectric layer LY5 when viewed from the stacking direction of the stacked body 110. In other words, the capacitor C23 in FIG. 2 is structured by the capacitor electrode PC31 and the capacitor electrode PC12. Another portion of the capacitor electrode PC31 overlaps the capacitor electrode PC45 of the dielectric layer LY5 when viewed from the stacking direction of the stacked body 110. In other words, the capacitor C45 in FIG. 2 is structured by the capacitor electrode PC31 and the capacitor electrode PC45.

A strip capacitor electrode PC15 extending in the X-axis direction is disposed on the dielectric layer LY9. When viewed from the stacking direction of the stacked body 110, one end of the capacitor electrode PC15 overlaps the capacitor electrode PC10 of the resonator RC1, and the other end of the capacitor electrode PC15 overlaps the capacitor electrode PC50 of the resonator RC5. In other words, the capacitor C15 in FIG. 2 is structured by the capacitor electrodes PC10, PC15 and PC50.

Advantageous Effects of the Shape of the Coupling Electrode on the Attenuation Characteristics As described with reference to FIG. 4, in the filter device 100, the resonators adjacent to each other are capacitively coupled via a capacitor. The capacitor that couples the resonators is achieved by arranging a plate electrode extending from one resonator and an electrode for a capacitor that defines an LC parallel resonator in the other resonator to face each other.

The plate electrode extending from one resonator (hereinafter, referred to as "coupling electrode") has a certain length, and therefore also defines and functions as an inductor having a predetermined inductance value. Therefore, the coupling electrode defining the capacitor itself may become a distributed constant LC parallel resonator, which unintentionally reduces the attenuation characteristics near the resonance frequency of the coupling electrode.

In recent communication apparatuses, communications may be conducted using radio waves based on a plurality of communication standards having different frequency bands, such as, for example, Wi-Fi, 4G, and 5G. In such a case, if the attenuation characteristics in a frequency band (i.e., the non-passband) other than the passband targeted by the filter device are reduced, this may have an adverse effect on other communication apparatuses using a frequency band within the non-passband. Further, when the filter device is used in a reception circuit, a signal corresponding to the frequency band with reduced attenuation characteristics may appear as noise in the reception signal.

Therefore, in the filter device 100 according to the present example embodiment, each of the capacitor which is disposed between the resonator RC1 and the resonator RC2 and arranged closest to the input terminal T1 and the capacitor which is disposed between the resonator RC5 and the resonator RC4 and arranged closest to the output terminal T2 is structured by using an electrode having two parallel paths as the coupling electrode. As described above, by using the coupling electrode in a parallel configuration, a substantial 1 inductance value of the coupling electrode can be reduced, and thus the resonance frequency of the coupling electrode can be set to a higher frequency than a coupling electrode with a single path. Thus, it is possible to prevent the reduction of attenuation characteristics in a predetermined frequency band.

Figure 5:
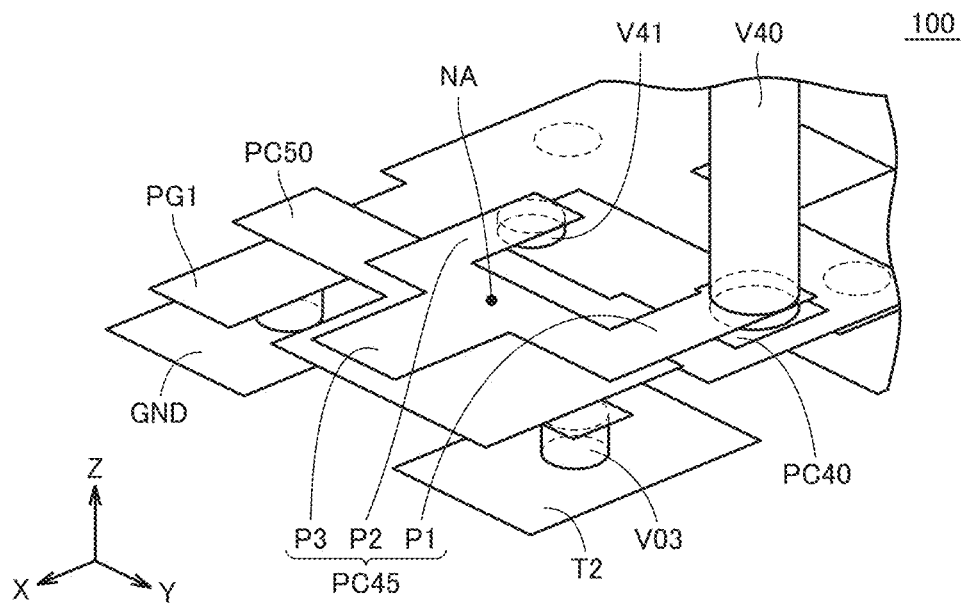
FIG. 5 is a partially enlarged perspective view illustrating the filter device of FIG. 4.
Figure 6:
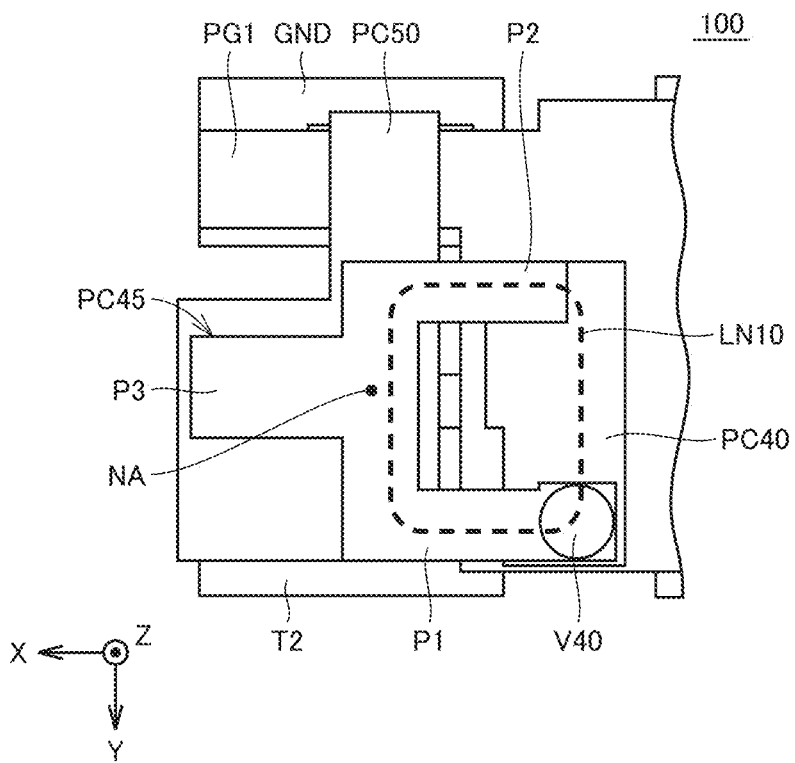
FIG. 6 is a partially enlarged plan view illustrating the filter device of FIG. 5.

FIGS. 5 and 6 are diagrams for explaining a detailed structure of the coupling electrode in the filter device 100 according to the present example embodiment. In FIGS. 5 and 6, the capacitor electrode PC45 will be described as an example electrode corresponding to the coupling electrode between the resonator RC4 and the resonator RC5. FIG. 5 is an enlarged perspective view illustrating a portion of the capacitor electrode PC45. FIG. 6 is an enlarged plan view illustrating the portion of the capacitor electrode PC45. The same applies to the capacitor electrode PC12 corresponding to the coupling electrode between the resonator RC1 and the resonator RC2.

With reference to FIGS. 5 and 6, the capacitor electrode PC45 includes strip electrodes P1, P2 and P3. The electrodes P1 and P2 each have an L or substantially L shape. The first end of the electrode P1 is connected to the first end of the electrode P2 at a node NA in FIG. 5. The second end of the electrode P1 is connected to the capacitor electrode PC40 via the via V40. The second end of the electrode P2 is connected to the capacitor electrode PC40 via the via V41. The first end of the electrode P3 is also connected to the node NA. The second end of the electrode P3 is an open end.

In other words, between the node NA and the capacitor electrode PC40, an annular structure is provided by the first path of the electrode P1 and the second path of the electrode P2, as illustrated by the broken line LN10 in FIG. 6. This annular structure reduces the inductance value of the capacitor electrode PC45.

The shape of the electrodes P1, P2 and P3 defining the capacitor electrode PC45 is not necessarily limited to an elongated strip shape as illustrated in FIGS. 5 and 6. For example, the electrode P1, P2 may have a rectangular or substantially rectangular shape with a wider line width or a shape with a varying line width along the signal transmission path, as long as it can define an annular structure with the capacitor electrode PC40. Similarly, the electrode P3 is not limited to a rectangular or substantially rectangular shape as illustrated in FIGS. 5 and 6, it may have a shape with a varying line width, or a bent shape.

Filter Characteristics

Next, simulation results of the pass characteristics of the filter device 100 according to the present example embodiment and simulation results of the pass characteristics of a filter device 100X according to a comparative example will be described with reference to FIGS. 7 and 8.

Figure 7:
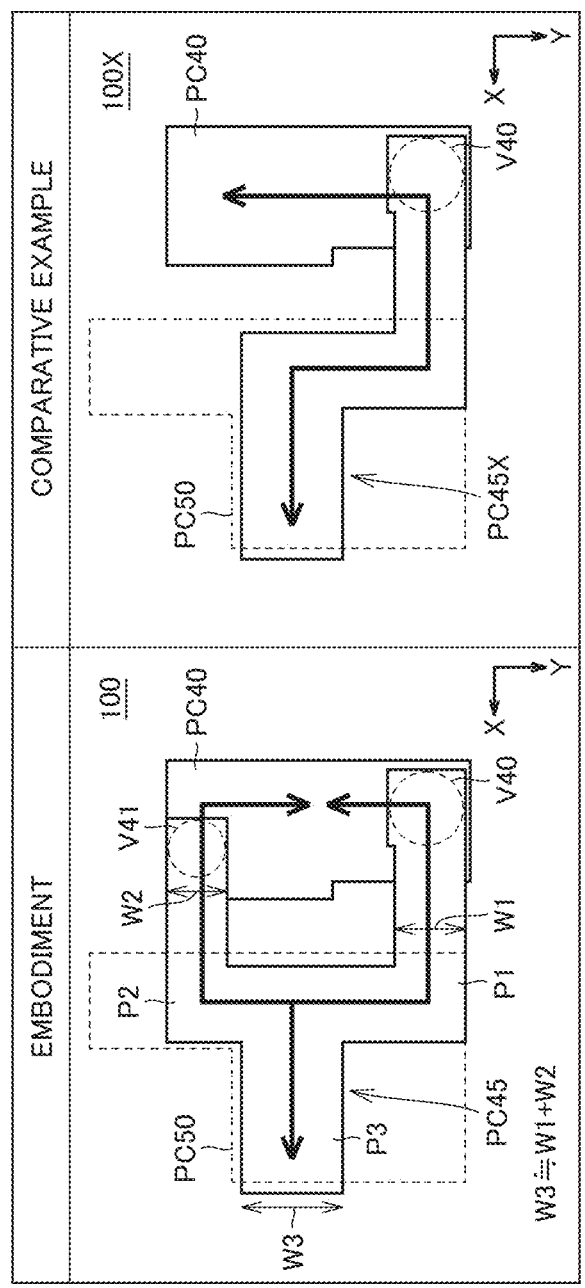
FIG. 7 is a view illustrating a coupling electrode in a filter device according to an example embodiment of the present invention and a coupling electrode in a filter device according to a comparative example.

FIG. 7 is a diagram illustrating the shape of the capacitor electrode PC45 of the filter device 100 according to the present example embodiment and the shape of a capacitor electrode PC45X of the filter device 100X according to the comparative example. With reference to FIG. 7, in the capacitor electrode PC45, as described above, an annular structure is provided by the electrodes P1 and P2. On the other hand, the capacitor electrode PC45X of the comparative example is a single strip electrode.

In the capacitor electrode PC45, it is preferable that the sum of a line width W1 of the electrode P1 and a line width W2 of the electrode P2 is equal or approximately equal to a line width W3 of the electrode P3. Thus, even if a positional misalignment occurs between the capacitor electrode PC45 and the capacitor electrode PC50 of the resonator RC5 in the X-axis direction during manufacturing, it is possible to reduce the variation in the area where the capacitor electrode PC50 and the capacitor electrode PC45 overlap each other. Accordingly, it is possible to prevent the variation of the capacitive coupling between the resonator RC4 and the resonator RC5 caused by the positional misalignment.

The expression "approximately equal to" above means that an error of, for example, about ±20% is acceptable. In other words, it is preferable that the sum of the line width W1 of the electrode P1 and the line width W2 of the electrode P2 is, for example, about 0.8 times to about 1.2 times the line width W3 of the electrode P3.

Figure 8:
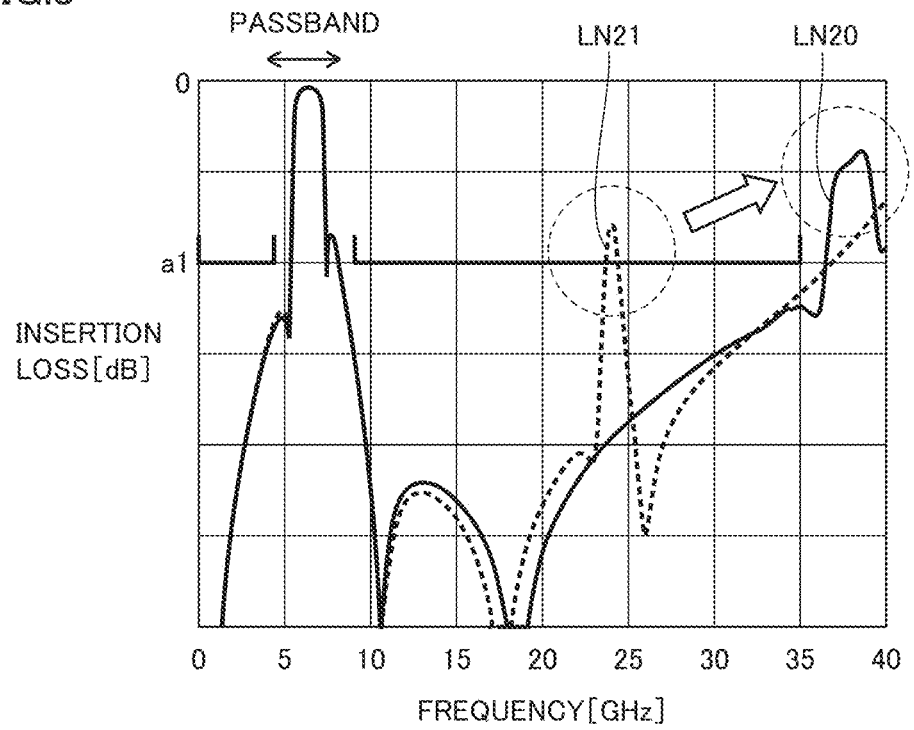
FIG. 8 is a diagram for explaining filter characteristics of a filter device according to an example embodiment of the present invention and filter characteristics of the filter device according to the comparative example.

FIG. 8 is a diagram for explaining filter characteristics of the filter device according to the present example embodiment and filter characteristics of the filter device according to the comparative example. In FIG. 8, the horizontal axis represents frequency, and the vertical axis represents insertion loss. In the example of FIG. 8, the passband of the filter device 100 is about 6 GHz to about 7 GHz, and the required attenuation characteristics of the non-passband (stopband) are al [dB] within about 0 GHz to about 4.5 GHZ and about 9.0 GHz to about 35 GHZ. In FIG. 8, the solid line LN20 indicates the filter characteristics of the filter device 100 of the present example embodiment, and the broken line LN21 indicates the filter characteristics of the filter device 100X of the comparative example.

With reference to FIG. 8, in the comparative example, the resonance frequency of the coupling electrode appears around 24 GHz in the non-passband, and the insertion loss decreases at or around the frequency. Therefore, the required attenuation characteristics are not achieved.

In contrast, in the filter device 100 of the present example embodiment, the resonance frequency of the coupling electrode is around 37 GHz, which is outside the range of the non-passband where the attenuation characteristics are required. Thus, the attenuation characteristics in the non-passband satisfy the required level.

As described above, in the filter device including a plurality of resonators, by using the coupling electrode to capacitively couple adjacent resonators to define an annular structure and setting the resonance frequency of the coupling electrode higher, it is possible to prevent the reduction of attenuation characteristics in the non-passband.

In the filter device 100, it is described that the annular structure is provided by a capacitor electrode (a coupling electrode) and a capacitor electrode of a resonator that is connected to the coupling electrode, it is acceptable that the annular structure may include a single coupling electrode, and the annular structure may be connected to the capacitor electrode of the resonator via a via or a wiring pattern.

In the arrangement of the filter device 100 according to the present example embodiment, since the coupling electrode in the resonator close to the input terminal and the output terminal tend to be relatively long, attention is directed to the capacitive coupling between the resonator RC1 and the resonator RC2 and the capacitive coupling between the resonator RC4 and the resonator RC5. Additionally or alternatively, in a filter device having another structure, the annular structure of the present example embodiment may be applied to the coupling electrode between the resonator RC2 and the resonator RC3 and/or the coupling electrode between the resonator RC3 and the resonator RC4.

The via may pass through an opening of the annular structure of the coupling electrode.

Each of the "resonator RC1" and the "resonator RC5" in the present example embodiment corresponds to the "first resonator", and each of the "resonator RC2" and the "resonator RC4" in the present example embodiment corresponds to the "second resonator". Each of the "capacitor electrode PC12" and the "capacitor electrode PC45" in the present example embodiment corresponds to the "coupling electrode". Each of the "capacitor electrode PC10" and the "capacitor electrode PC50" in the present example embodiment corresponds to the "first capacitor electrode", and each of the "capacitor electrode PC20" and the "capacitor electrode PC40" in the present example embodiment corresponds to the "second capacitor electrode". The "capacitor electrode PC01" and the "capacitor electrode PC02" in the present example embodiment correspond to the "third capacitor electrode" and the "fourth capacitor electrode", respectively. The "ground electrode PG1" in the present example embodiment corresponds to the "ground electrode". The "electrode P1", the "electrode P2" and the "electrode P3" in the present example embodiment correspond to the "first electrode", the "second electrode" and the "third electrode", respectively.

Modifications

In FIGS. 9 to 13, modifications of coupling electrodes to provide a capacitive coupling between resonators will be described. Although the coupling electrode between the resonator RC4 and the resonator RC5 is described in each modification of FIGS. 9 to 13, the configuration of each modification may be applied to the coupling electrode between the resonator RC1 and the resonator RC2.

First Modification

In a first modification of an example embodiment of the present invention, the coupling electrode and the capacitor electrode of the resonator connected to the coupling electrode are disposed on the same dielectric layer.

Figure 9:
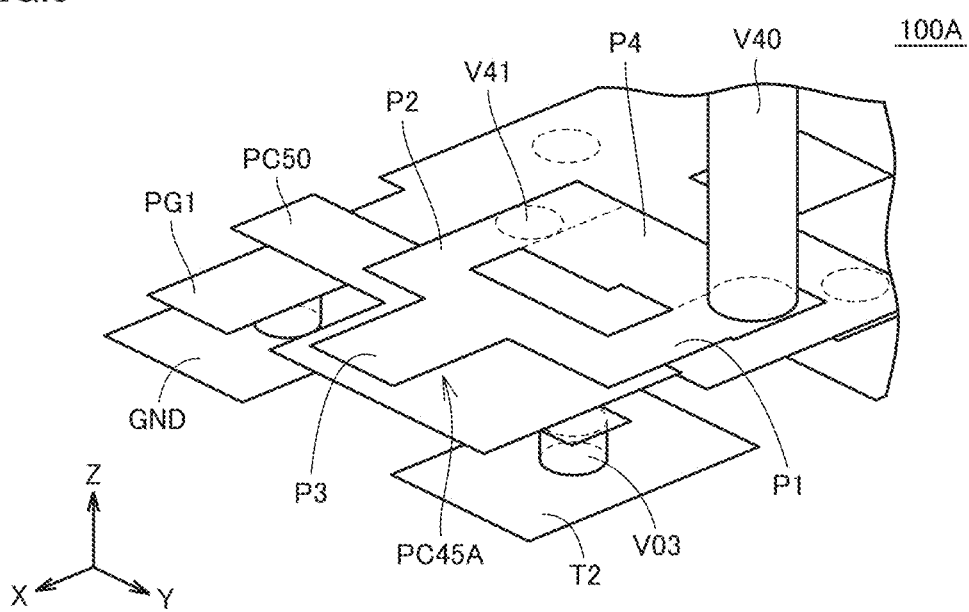
FIG. 9 is a partially enlarged perspective view illustrating a filter device according to a first modification of an example embodiment of the present invention.

FIG. 9 is a partially enlarged perspective view illustrating a filter device 100A according to the first modification. In FIG. 9, the capacitor electrode PC40 of the resonator RC4 and the capacitor electrode PC45 which defines the coupling electrode as described with reference to FIG. 5 in the above example embodiment are replaced with a capacitor electrode PC45A. In FIG. 9 and FIGS. 10 to 13 below, the description of the same or corresponding elements as those in FIG. 5 will not be repeated.

With reference to FIG. 9, in addition to the electrodes P1, P2 and P3 of the capacitor electrode PC45 in FIG. 5, the capacitor electrode PC45A further includes an electrode P4 corresponding to a portion of the capacitor electrode PC40. The electrode P4 is connected to the end of the electrode P1 or P2 to which the via V40 or V41 is connected as illustrated in FIG. 5. In other words, an annular structure is provided by the electrodes P1, P2 and P4. The via V40 of the resonator RC4 is connected to the capacitor electrode PC45A.

For the ease of explanation, the electrodes P1 to P4 of the capacitor electrode PC45A have been described as individual elements, but in practice, the electrodes P1 to P4 are provided by an integral electrode on the same dielectric layer.

As described above, even with such a configuration that the coupling electrode to capacitively couple the resonators and the capacitor electrode of the resonator to which the coupling electrode is connected are disposed on the same dielectric layer, since the coupling electrode and the capacitor electrode define an annular structure, the resonance frequency of the coupling electrode can be set higher, which makes it possible to prevent the reduction of attenuation characteristics in the non-passband.

Second Modification

In a second modification of an example embodiment of the present invention, the protruding portion (i.e., the electrode P3) of the coupling electrode is removed.

Figure 10:
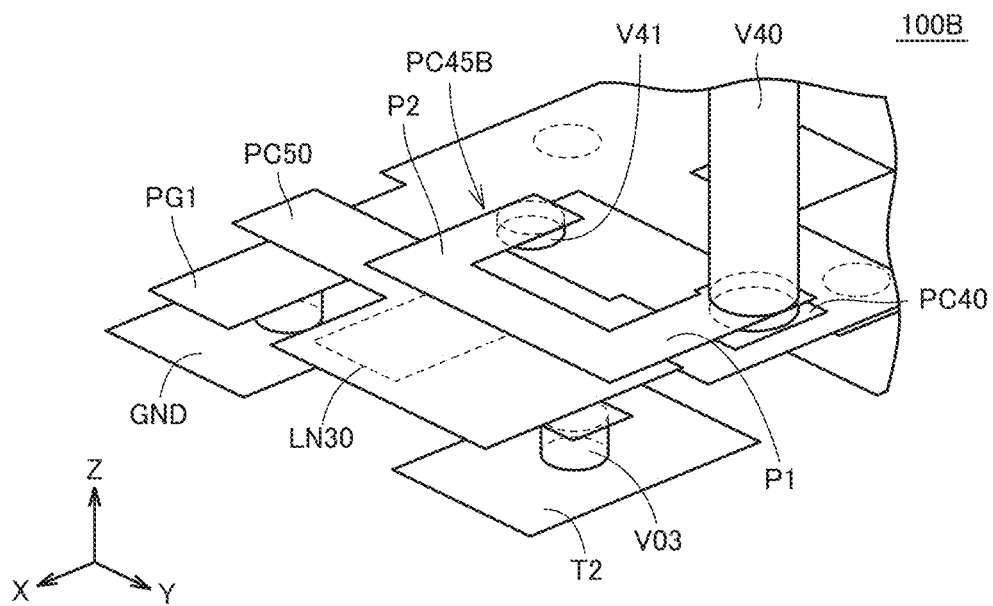
FIG. 10 is a partially enlarged perspective view illustrating a filter device according to a second modification of an example embodiment of the present invention.

FIG. 10 is a partially enlarged perspective view illustrating a filter device 100B according to the second modification. In FIG. 10, the capacitor electrode PC45 described with reference to FIG. 5 in the above example embodiment is replaced with a capacitor electrode PC45B.

With reference to FIG. 10, the capacitor electrode PC45B has a configuration such that the electrode P3 protruding in the X-axis direction from the node NA of the capacitor electrode PC45 as illustrated in FIG. 5 is removed (as indicated by the broken line LN30 in FIG. 10). In other words, the capacitor electrode PC45B includes only the electrodes P1 and P2.

Even with such a configuration, since the electrodes P1 and P2 of the capacitor electrode PC45B and the capacitor electrode PC40 of the resonator RC4 define an annular structure, the resonance frequency of the coupling electrode can be set higher, which makes it possible to prevent the reduction of attenuation characteristics in the non-passband.

As compared with the capacitor electrode PC45, the capacitor electrode PC45B has a smaller overlapping area with the capacitor electrode PC50 of the resonator RC5, and thus the coupling degree of capacitive coupling may be slightly lower than that in FIG. 5. Therefore, the configuration of modification 2 may be used when the required coupling degree of capacitive coupling is relatively low. Alternatively, the line widths of the electrodes P1 and P2 may be increased to ensure a coupling degree equivalent to that of the capacitor electrode PC45.

Third Modification

In the third modification of an example embodiment of the present invention, the coupling electrode and the capacitor electrode of the resonator to which the coupling electrode is connected are arranged in a different order in the stacking direction.

Figure 11:
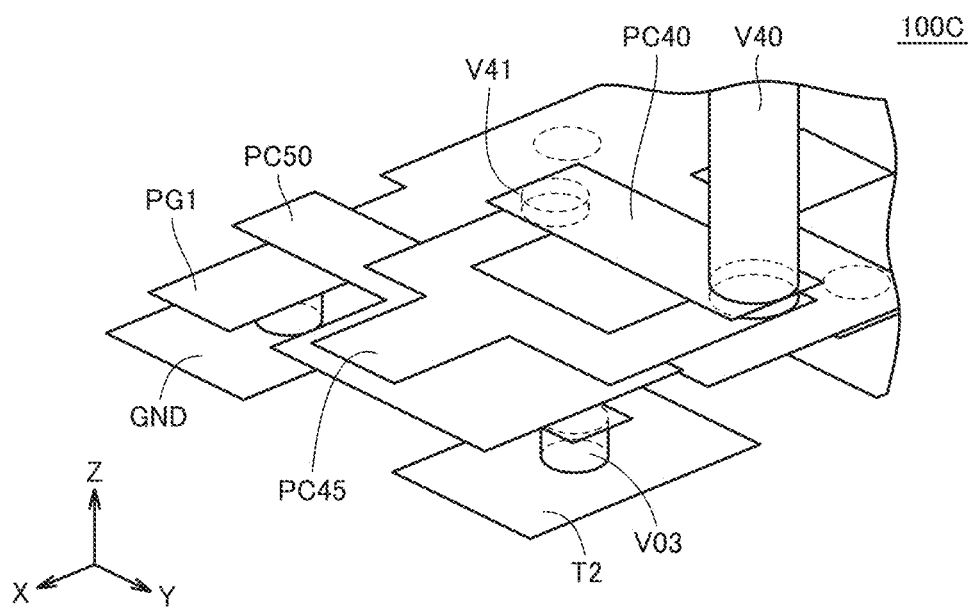
FIG. 11 is a partially enlarged perspective view illustrating a filter device according to a third modification of an example embodiment of the present invention.

FIG. 11 is a partially enlarged perspective view illustrating a filter device 100C according to the third modification. In FIG. 11, the capacitor electrode PC40 of the resonator RC4 is disposed closer to the upper surface 111 than the capacitor electrode PC45 which defines a coupling electrode. In other words, the capacitor electrode PC45 is disposed on a dielectric layer arranged between the capacitor electrode PC40 and the ground electrode PG1.

Even with such a configuration, since the distance between the capacitor electrode PC45 and the ground electrode PG1 in the stacking direction can be shortened as compared with the case of FIG. 5, the coupling degree of the capacitive coupling between the resonator RC4 and the resonator RC5 can be increased. Since the capacitor electrode PC45 and the capacitor electrode PC40 define an annular structure, it is possible to prevent the reduction of attenuation characteristics in the non-passband.

Fourth Modification

In a fourth modification of an example embodiment of the present invention, the coupling electrode is structured by electrodes disposed on a plurality of dielectric layers.

Figure 12:
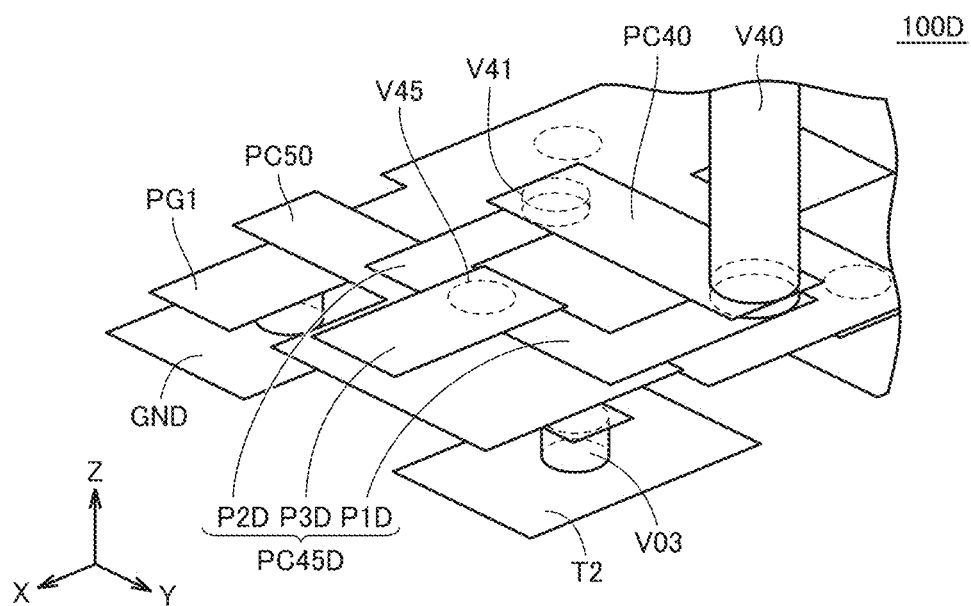
FIG. 12 is a partially enlarged perspective view illustrating a filter device according to a fourth modification of an example embodiment of the present invention.

FIG. 12 is a partially enlarged perspective view illustrating a filter device 100D according to the fourth modification. In FIG. 12, the capacitor electrode PC45 in FIG. 11 is replaced with a capacitor electrode PC45D.

The capacitor electrode PC45D includes electrodes P1D and P2D disposed on the same dielectric layer, an electrode P3D disposed on a dielectric layer closer to the upper surface 111 than the electrodes P1D and P2D, and a via V45 to connect the electrodes P1D, P2D and P3D to each other. In other words, the capacitor electrode PC45D corresponds to such a configuration that the protruding portion (i.e., the electrode P3) of the capacitor electrode PC45 is disposed on a dielectric layer different from the electrodes P1 and P2, and is connected to the electrodes P1 and P2 at the node NA via the via V45.

Even with such a configuration, since the electrodes P1D and P2D and the capacitor electrode PC40 of the resonator RC4 define an annular structure, it is possible to prevent the reduction of attenuation characteristics in the non-passband.

In the example of FIG. 12, the electrode P3D (the protruding portion) is disposed on a dielectric layer that is closer to the upper surface 111 than the electrodes P1D and P2D, but the electrode P3D may be disposed on a dielectric layer that is closer to the ground electrode PG1 than the electrodes P1D and P2D.

Fifth Modification

In the fifth modification of an example embodiment of the present invention, the coupling electrode and the capacitor electrode which defines a capacitor with the coupling electrode are arranged in a different order in the stacking direction.

Figure 13:
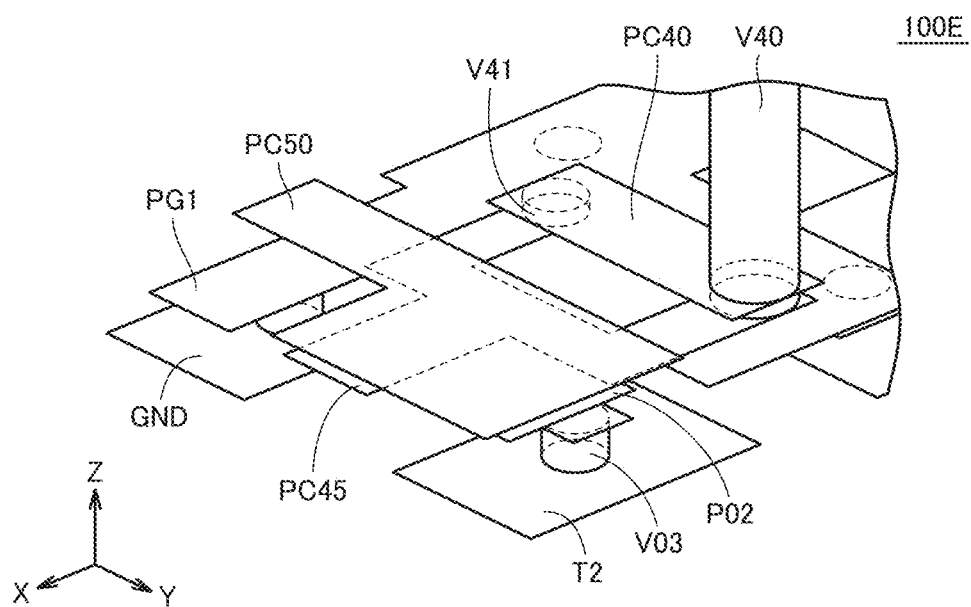
FIG. 13 is a partially enlarged perspective view illustrating a filter device according to a fifth modification of an example embodiment of the present invention.

FIG. 13 is a partially enlarged perspective view illustrating a filter device 100E according to the fifth modification. In FIG. 13, the capacitor electrode PC50 of the resonator RC5 in FIG. 11 is disposed closer to the upper surface 111 than the capacitor electrode PC45 which is a coupling electrode. In other words, the capacitor electrode PC45 is disposed on a dielectric layer arranged between the capacitor electrode PC50 and the ground electrode PG1 of the resonator RC5.

Even with such a configuration, since the electrodes P1 and P2 of the capacitor electrode PC45 and the capacitor electrode PC40 of the resonator RC4 define an annular structure, it is possible to prevent the reduction of attenuation characteristics in the non-passband.

It will be appreciated by those skilled in the art that the above-described example embodiments are illustrative examples of the following aspects.

While example embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A filter device comprising:
   a stacked body including a plurality of dielectric layers that are stacked and a first surface and a second surface;
   an input terminal, an output terminal, and a ground terminal on the second surface of the stacked body;
   a ground electrode inside the stacked body and connected to the ground terminal;
   a first resonator and a second resonator provided in a signal transmission path between the input terminal and the output terminal on a dielectric layer of the plurality of between the first surface and the ground electrode; and
   a coupling electrode to couple the first resonator and the second resonator by capacitive coupling; wherein
   the first resonator includes a first capacitor electrode defining a capacitor with the ground electrode, and the second resonator includes a second capacitor electrode defining a capacitor with the ground electrode;
   the coupling electrode is connected to the second capacitor electrode and defines a capacitor with the first capacitor electrode;
   the coupling electrode includes a first electrode and a second electrode, each including a first end and a second end;
   the first end of the first electrode and the first end of the second electrode are connected to each other; and
   the second end of the first electrode and the second end of the second electrode are connected to the second capacitor electrode.

2. The filter device according to claim 1, wherein the first electrode and the second electrode define an annular structure.

3. The filter device according to claim 1, wherein the first electrode, the second electrode, and the second capacitor electrode define an annular structure.

4. The filter device according to claim 2, wherein the annular structure is provided on a single dielectric layer of the plurality of dielectric layers.

5. The filter device according to claim 2, wherein the annular structure extends across at least two of the plurality of dielectric layers.

6. The filter device according to claim 5, wherein the coupling electrode is provided on a dielectric layer of the plurality of dielectric layers between the second capacitor electrode and the ground electrode.

7. The filter device according to claim 5, wherein the second capacitor electrode is provided on a dielectric layer of the plurality of dielectric layers between the coupling electrode and the ground electrode.

8. The filter device according to claim 1, wherein the coupling electrode includes a third electrode protruding from the first end of the first electrode and the first end of the second electrode.

9. The filter device according to claim 8, wherein the first electrode and the second electrode are provided on a dielectric layer of the plurality of dielectric layers between the third electrode and the ground electrode.

10. The filter device according to claim 8, wherein a sum of a line width of the first electrode and a line width of the second electrode is about 0.8 times to about 1.2 times a line width of the third electrode.

11. The filter device according to claim 1, wherein the first resonator is provided in the signal transmission path and positioned closest to the input terminal or the output terminal.

12. The filter device according to claim 11, further comprising a third capacitor electrode connected to the input terminal and defining a capacitor with the first capacitor electrode.

13. The filter device according to claim 11, further comprising a fourth capacitor electrode connected to the output terminal and defining a capacitor with the first capacitor electrode.

14. The filter device according to claim 1, further comprising a third resonator provided in the signal transmission path and between the input terminal and the first resonator.

15. The filter device according to claim 14, further comprising a fourth resonator provided in the signal transmission path and between the output terminal and the second resonator.

16. The filter device according to claim 1, further comprising a fourth resonator provided in the signal transmission path and between the output terminal and the second resonator.

17. A radio-frequency front-end circuit comprising the filter device according to claim 1.

18. The radio-frequency front-end circuit according to claim 17, wherein the first electrode and the second electrode define an annular structure.

19. The radio-frequency front-end circuit according to claim 17, wherein the first electrode, the second electrode, and the second capacitor electrode define an annular structure.

20. The radio-frequency front-end circuit according to claim 18, wherein the annular structure is provided on a single dielectric layer of the plurality of dielectric layers.

\* \* \* \* \*